United States Patent
Cho

(10) Patent No.: US 6,828,835 B2
(45) Date of Patent: Dec. 7, 2004

(54) DELAY LOCKED LOOP CIRCUIT INTEROPERABLE WITH DIFFERENT APPLICATIONS

(75) Inventor: Yong-Deok Cho, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/635,717

(22) Filed: Aug. 5, 2003

(65) Prior Publication Data

US 2004/0100312 A1 May 27, 2004

(30) Foreign Application Priority Data

Nov. 27, 2002 (KR) ................................ 10-2002-0074227

(51) Int. Cl.$^7$ ............................................... H03L 7/06
(52) U.S. Cl. ............................... 327/158; 331/DIG. 2; 375/376
(58) Field of Search .............................. 327/155, 156, 327/158–161; 331/DIG. 2, 1 A; 375/376

(56) References Cited

U.S. PATENT DOCUMENTS

| | | | | |
|---|---|---|---|---|
| 6,005,426 A | * | 12/1999 | Lin et al. | 327/158 |
| 6,081,145 A | | 6/2000 | Bandai et al. | 327/321 |
| 6,130,552 A | | 10/2000 | Jefferson et al. | 326/39 |
| 6,269,051 B1 | * | 7/2001 | Funaba et al. | 365/233 |
| 6,292,016 B1 | | 9/2001 | Jefferson et al. | 326/39 |
| 6,342,796 B2 | * | 1/2002 | Jung | 327/141 |
| 6,437,616 B1 | * | 8/2002 | Antone et al. | 327/158 |
| 6,437,619 B2 | | 8/2002 | Okuda et al. | 327/158 |
| 6,509,776 B2 | * | 1/2003 | Kobayashi et al. | 327/277 |
| 6,535,989 B1 | | 3/2003 | Dvorak et al. | 713/500 |
| 2002/0017939 A1 | | 2/2002 | Okuda et al. | |
| 2002/0180500 A1 | | 12/2002 | Okuda et al. | |

FOREIGN PATENT DOCUMENTS

| | | |
|---|---|---|
| JP | 11-065699 | 3/1999 |
| JP | 2002-043934 | 2/2002 |
| JP | 2002-049438 | 2/2002 |

* cited by examiner

Primary Examiner—Minh Nguyen
(74) Attorney, Agent, or Firm—Blakely Sokoloff Taylor & Zafman

(57) ABSTRACT

A new Delay Locked Loop (DLL) circuit is interoperable with products having different applications by controlling the count of a DLL circuit according to the operating clock frequency. Therefore, the products having different applications can be manufactured in the same manufacturing processes and test processes. The DLL circuit includes: a clock buffer for receiving an external clock signal; a first frequency divider for dividing the buffered clock signal; a phase detector for detecting phase error; a DLL controller for generating shift-control signals; a delay line for locking between an internal clock signal and an external clock signal; a second frequency divider for dividing the internal clock signal; and a replica unit for modeling tAC path.

5 Claims, 6 Drawing Sheets

DELAY LOCKED LOOP CIRCUIT INTEROPERABLE WITH DIFFERENT APPLICATIONS

FIELD OF THE INVENTION

The present invention relates to a Delay Locked Loop (DLL) circuit; and, more particularly, to a DLL circuit used in an Application Specific Integrated Circuit (ASIC) or a Double Data Rate Synchronous Dynamic Random Access Memory (DDR SDRAM) for eliminating clock skew.

DESCRIPTION OF RELATED ART

Generally, a DLL circuit is used for synchronizing an internal clock distributed in a semiconductor memory device and an external clock from chipset. That is, when the external clock is used in the chip, timing skew occurs. The DLL circuit synchronizes the internal clock and the external clock by controlling the time-delay step in the variable delay line.

FIG. 1 is a block diagram showing a conventional delay locked loop (DLL) circuit.

The conventional DLL circuit includes a delay modeling unit 110, a phase detector 120, a counter and a decoder 130 and a digital delay line 140.

The delay modeling unit 110 is a replica path (tAC path) from input clock to output. The phase detector 120 compares the phase of the feedback clock with the external clock, and generates a shift-indicate signal. The counter and the decoder 130 generate a shift-control signal in order to control an amount of delay according to the former signal. The digital delay line 140 has a variable delay according to the shift-control signal, and outputs the skew-compensated clock to the delay modeling unit 110.

In the case of manufacturing the DDR SDRAM which is used for both a main memory and a graphic memory with the conventional DLL circuit, the DDR SDRAM has to be manufactured by using different manufacturing processes or test programs according to the applications of DDR SDRAM's, since a main memory or a graphic memory has a different clock speed and requires a different logic scheme.

Generally, a fuse or an anti-fuse is equipped with the DDR SDRAM in order to decide the applications of DDR SDRAM; whether it is used for a main memory or a graphic memory. The fuse has to be cut at a wafer level, while the anti-fuse is used after a binning process at a package level. The conventional methods of manufacturing a memory device mentioned above have several disadvantages. At first, a considerable amount of yield loss occurs at the wafer level. Secondly, it takes long time to program the anti-fuse at the package level. Finally, the fuse must be completely disconnected for reducing the yield loss.

Therefore, the conventional methods are very complicate to manage the manufacturing process and a great deal of manufacturing cost is needed.

SUMMARY OF THE INVENTION

It is, therefore, a primary object of the present invention to provide a new DLL circuit which is interoperable with different applications of those products by controlling the counter of the DLL circuit according to the clock frequency of each product.

In accordance with one aspect of the present invention, there is provided a DLL circuit including: a clock buffer for receiving an external clock signal and outputting the external clock signal; a first frequency divider for receiving the external clock signal and dividing the external clock frequency according to a dividing control signal; a phase detector for receiving the divided clock signal from the first frequency divider and the external signal from the clock buffer, detecting phase delay of two signals, generating a first comparison signal and a second comparison signal and generating a sample clock signal in order to perform sampling of the second comparison signal; a DLL controller for receiving the sample clock signal and the second comparison signal from the phase detector, outputting a dividing control signal at a second logic level in a high speed operation and outputting a dividing control signal at a first logic level in a low speed operation by analyzing the sample clock signal and the second comparison signal; a delay line for receiving the external clock signal from the clock buffer and the first comparison signal and the second comparison signal from the phase detector, performing shifting of the external clock signal to the left or right according to the first comparison signal and the second comparison signal, and outputting an internal clock signal; a second frequency divider for receiving the internal clock signal from the delay line and dividing the internal clock signal according to the dividing control signal; and a replica unit for receiving the divided internal signal from the second frequency divider, compensating the time delay between the external clock and the internal clock and generating the compensation clock signal.

BRIEF DESCRIPTION OF THE DRAWINGS

The other objects and features of the present invention will become apparent from the following description of preferred embodiments given in conjunction with the accompanying drawings, in which.

DETAILED DESCRIPTION OF THE INVENTION

Figure 1:
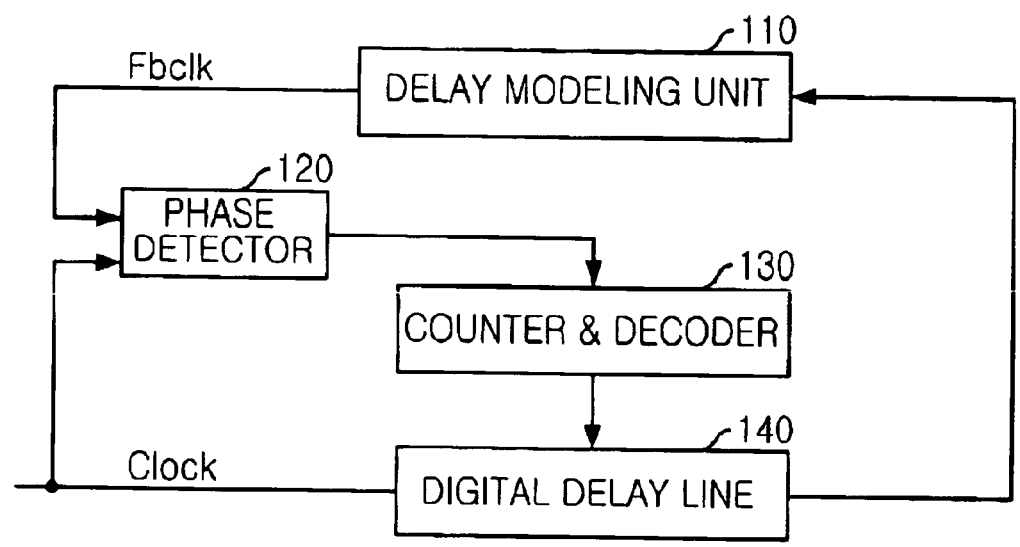
FIG. 1 is a block diagram showing a conventional delay locked loop (DLL) circuit.
Figure 2:
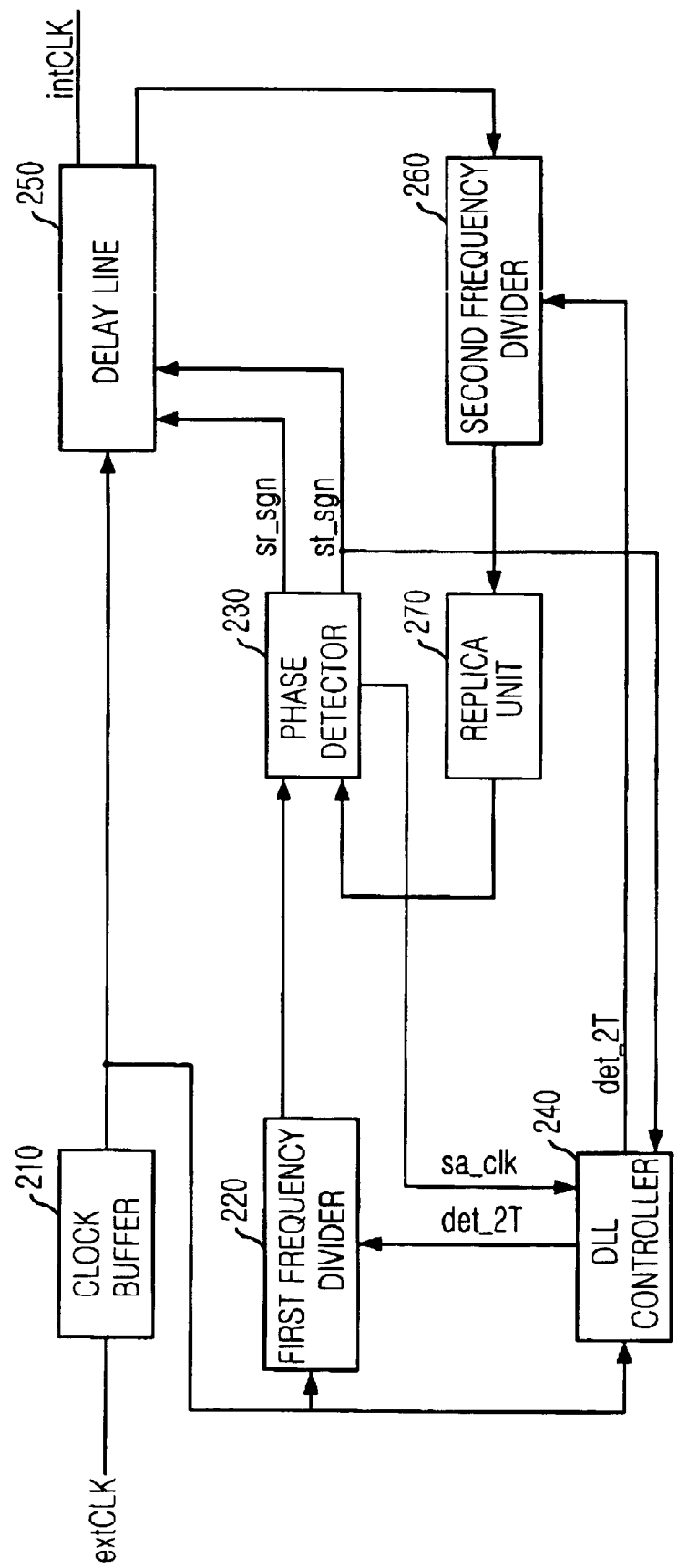
FIG. 2 is a block diagram illustrating a DLL circuit in accordance with the present invention.

FIG. 2 is a block diagram showing a DLL circuit in accordance with the present invention.

The DLL circuit includes a clock buffer 210, a first frequency divider 220, a phase detector 230, a DLL controller 240, a delay line 250, a second frequency divider 260 and a replica unit 270.

The external clock (extCLK) is inputted to the clock buffer 210 and the clock buffer 210 stores the external clock temporarily. Then, the clock buffer outputs the external clock to the first frequency divider 220, the DLL controller 240 and the delay line 250.

The first frequency divider 220 receives the external clock, divides the external clock according to dividing control signal (det_2T) and outputs the divided clock signal to the phase detector 230. The external clock signal is divided in order to give enough time to compensate delay that will be occurred by the phase detector 230.

The phase detector 230 receives the divided signal from the first frequency divider 220 and the external signal from the clock buffer 210. The phase detector 230 detects phase delay of two signals and generates a first comparison signal (sr_sgn) and a second comparison signal (sl_sgn). Then, the phase detector 230 generates a sample clock signal (sa_clk) in order to perform sampling of the second comparison signal and outputs the first comparison signal and the second comparison signal to the delay line and the sample clock signal and the second comparison signal to the DLL controller 240.

The DLL controller 240 receives the sample clock signal and the second comparison signal from the phase detector. The DLL controller 240 outputs a dividing control signal at a second logic level (High) in a high speed operation and outputs the dividing control signal at a first logic level (Low) in a low speed operation by analyzing the sample clock signal and the second comparison signal.

The delay line 250 receives the external clock signal from the clock buffer 210 and the first comparison signal and the second comparison signal from the phase detector 230. Then, the delay line 250 performs shifting of the external clock signal to the left or right according to the first comparison signal and the second comparison signal, and outputs an internal clock signal to the second frequency divider 260.

The second frequency divider 260 receives the internal clock signal from the delay line 250, divides the internal clock signal according to the dividing control signal and outputs the divided internal clock signal to the replica logic unit 270.

The replica unit 270 receives the divided internal clock signal from the second frequency divider 260 and compensates time delay between the external clock and the internal clock. Then, the replica unit 270 generates the compensation clock signal and outputs the compensation clock signal to the phase detector 230.

Figure 3:
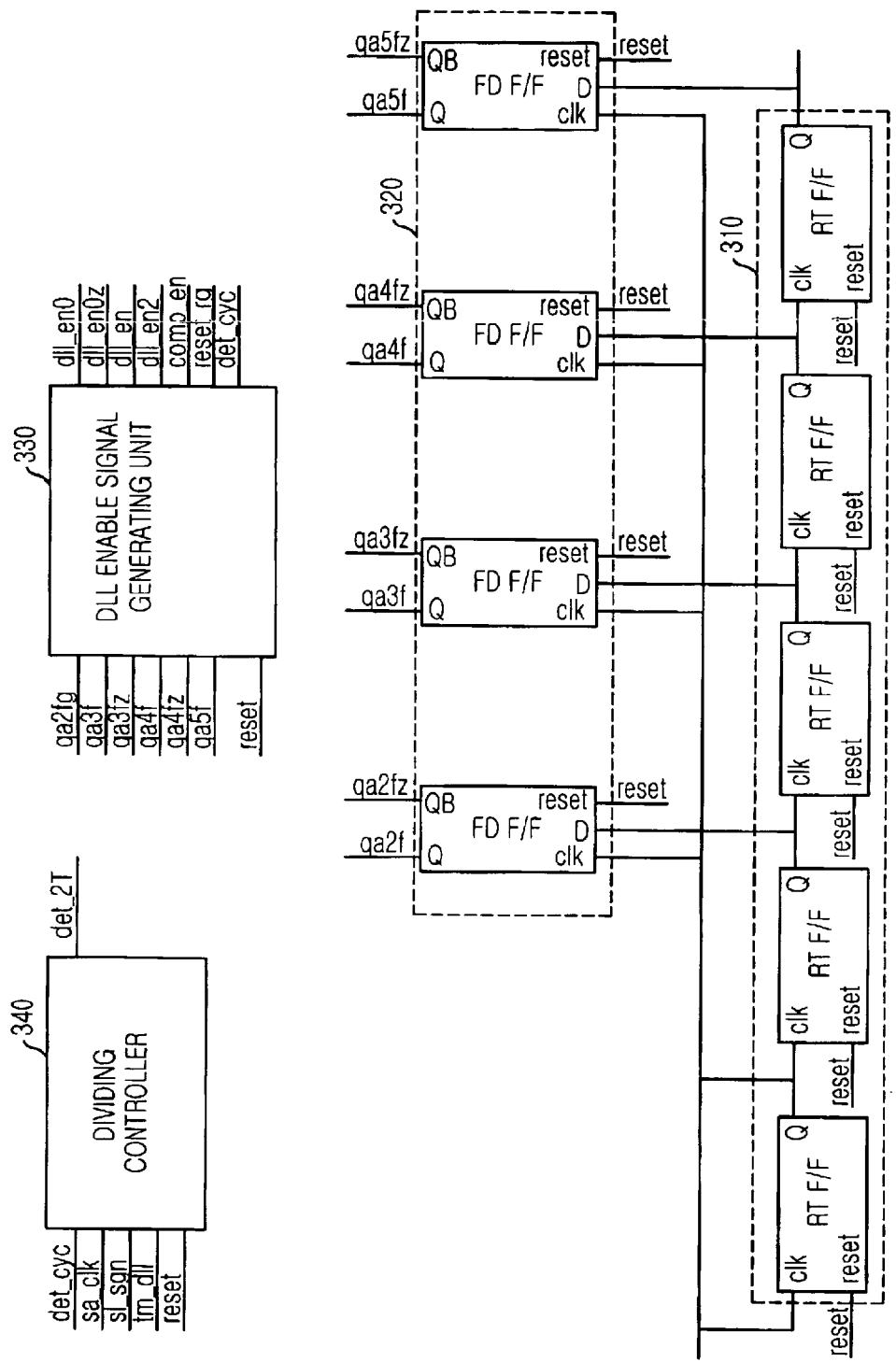
FIG. 3 is a block diagram representing a DLL controller in the DLL circuit in accordance with the present invention.

FIG. 3 is a block diagram showing a DLL controller in the DLL circuit in accordance with the present invention.

A divider 310 includes a plurality of RT flip-flops. The divider 310 receives the external clock signal from the clock buffer 210 and a reset signal from an external part, divides the external clock signal and outputs the divided clock signal to a synchronizing unit 320.

The synchronizing unit 320 includes a plurality of FD flip-flops. The synchronizing unit 320 receives the external clock signal from the clock buffer 210, a plurality of the divided clock signals from the divider 310 and a reset signal from an external part, and synchronizes the divided clock signals at falling edge. Then, the synchronizing unit 320 generates a plurality of the synchronized clock signals and outputs the synchronized clock signals and reversed signals of the synchronized clock signals to a DLL enable signal generating unit 330.

The DLL enable signal generating unit 330 receives a plurality of synchronized clock signals and the reversed signals of the synchronized clock signals (qa2fz, qa3f, qa3fz, qa4f, ga4fz and qa5f), and generates a plurality of enable signals and a dividing cycle signal (det_cyc). Then, the DLL enable signal generating unit 330 controls enable of the DLL circuit according to the enable signals and outputs the dividing cycle signal (det_cyc) to a dividing controller 340.

The dividing controller 340 receives the dividing cycle signal from the DLL enable signal generating unit 330, the sample clock signal (sa_clk) and the second comparison signal (sl_sgn) from the phase detector 230 and a reset signal (reset) and a test mode signal (tm_dll). The dividing controller 340 performs sampling of the second comparison signal according to the sample clock signal. Then, the dividing controller 340 outputs the dividing control signal (det_2T) at the second logic level (High) in the high speed operation and outputs the dividing control signal (det_2T) at the first logic level (Low) in the low speed operation by analyzing the second comparison signal and the sample clock signal. The test mode signal (tm_dll) is used to temporarily control the dividing control signal (det_2T) during test.

Figure 4:
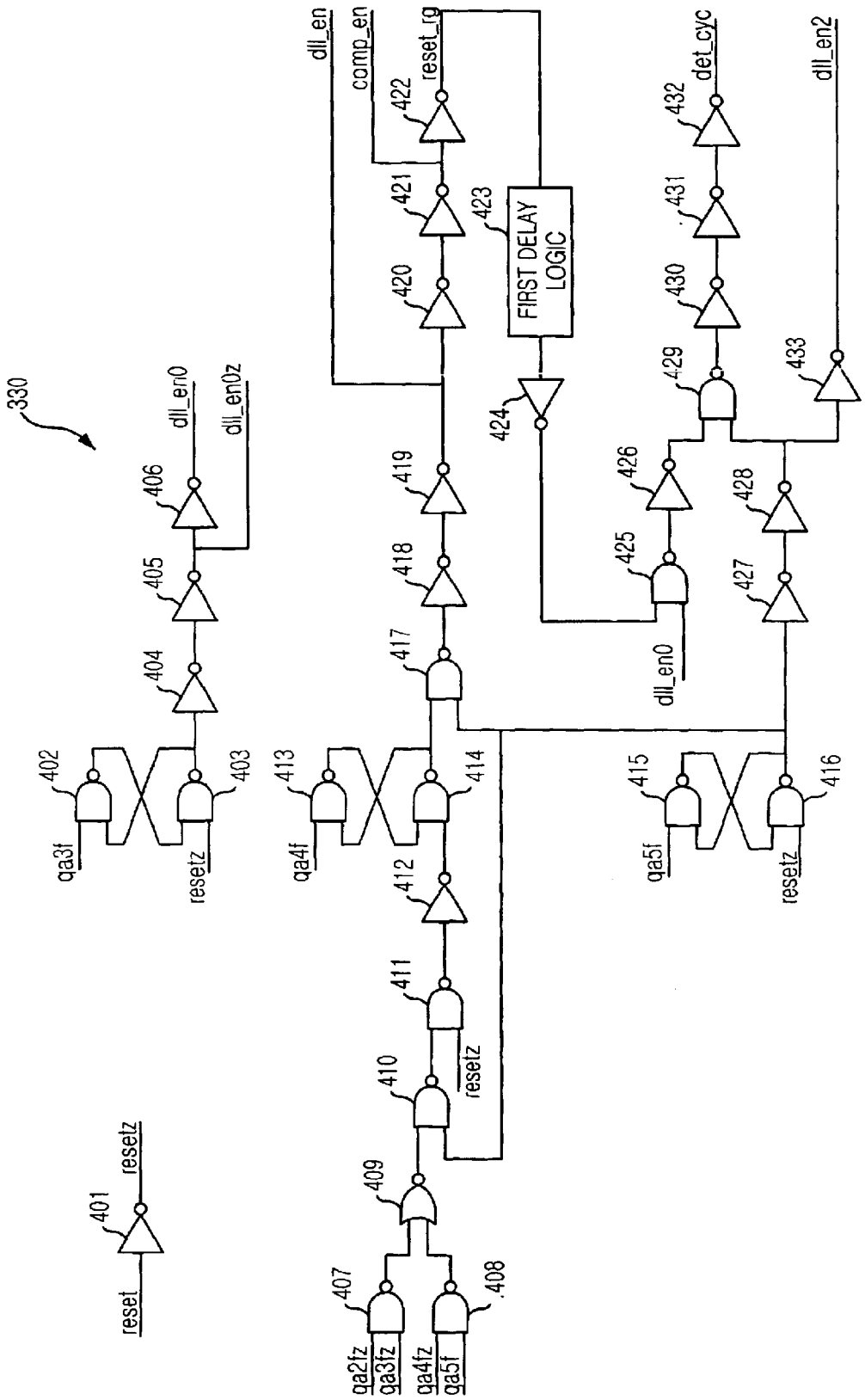
FIG. 4 is a block diagram depicting a DLL enable signal generating unit in the DLL circuit in accordance with the present invention.

FIG. 4 is a block diagram showing a DLL enable signal generating unit in the DLL circuit in accordance with the present invention.

A first inverter 401 reverses a received reset signal (reset) and outputs a reversed reset signal (resetz). A first NAND gate 402 receives the second synchronized clock signal (qa3f) among a plurality of the synchronized clock signals and the reversed signals of the synchronized clock signals, performs a NAND operation and outputs a result.

A second NAND gate 403 is cross-coupled with the first NAND gate 402 and receives the reversed reset signal (resetz). Then, the second NAND gate 403 performs a NAND operation and outputs a result. A second inverter 404 receives the output signal from the second NAND gate 403, reverses the output signal of the second NAND gate 403 and outputs a result.

A third inverter 405 receives the output signal from the second inverter 404, reverses the output signal and outputs a reversed signal (dll_en0z) of a first enable signal among a plurality of the enable signals. A forth inverter 406 receives the reversed signal (dll_en0z) of a first enable signal, reverses the reversed signal (dll_en0z) of a first enable signal and outputs a first enable signal (dll_en0) among a plurality of the enable signals.

A third NAND gate 407 receives the reversed signal (qa2fz) of the first synchronized clock signal and the reversed signal (qa3fz) of the second synchronized clock signal among a plurality of the synchronized clock signals and the reversed signals of the synchronized clock signals, performs a NAND operation and outputs a result.

A forth NAND gate 408 receives the reversed signal (qa4fz) of the third synchronized clock signal and the reversed signal (qa5fz) of the forth synchronized clock signal among a plurality of the synchronized clock signals and the reversed signals of the synchronized clock signals, performs a NAND operation and outputs a result.

A NOR gate 409 receives the output signals from the third NAND gate 407 and the forth NAND gate 408, performs a NOR operation and outputs a result. A fifth NAND gate 410 receives the output signal from the NOR gate 409, performs a NAND operation and outputs a result.

A sixth NAND gate 411 receives the reversed reset signal (resetz) and the output signal of the fifth NAND gate 410, performs a NAND operation and outputs a result. A fifth inverter 412 receives the output signal from the sixth NAND gate, reverses the output signal and outputs a result.

A seventh NAND gate 413 receives the third synchronized clock signal (qa4f) among a plurality of the synchronized clock signals and the reversed signals of the synchronized clock signals, performs a NAND operation and outputs a result.

An eighth NAND gate 414 is cross-coupled with the seventh NAND gate 413. The eighth NAND gate 414 receives the output signal from the fifth inverter 412, performs a NAND operation and outputs a result.

A ninth NAND gate 415 receives the forth synchronized clock signal (qa5f) among a plurality of the synchronized clock signals and the reversed signals of the synchronized clock signals, performs a NAND operation and outputs a result.

A tenth NAND gate 416 is cross-coupled with the ninth NAND gate 415. The tenth NAND gate 416 receives the reversed reset signal (resetz), performs a NAND operation and outputs a result to the fifth NAND gate 410.

An eleventh NAND gate 417 receives the output signals of the eighth NAND gate 414 and the tenth NAND gate 416, performs a NAND operation and outputs a result. A sixth inverter 418 receives the output signal from the eleventh NAND gate 417, reverses the output signal of the eleventh NAND gate 417 and outputs a result.

A seventh inverter 419 receives the output signal of the sixth inverter 418, reverses the output signal of the sixth inverter 418 and outputs a total enable signal (dll_en) among a plurality of the enable signals. An eighth inverter 420 receives the output signal from the seventh inverter 419, reverses the output signal from the seventh inverter 419 and outputs a result.

A ninth inverter 421 receives the output signal from the eighth inverter 418, reverses the output signal of the eighth inverter 418 and outputs a comparison enable signal (comp_en) among a plurality of the enable signals. A tenth inverter 422 receives the output signal from the ninth inverter 421, reverses the output signal of the ninth inverter 421 and outputs a result.

A first delay unit 423 receives the output signal from the tenth inverter 422, delays the output signal from the tenth inverter 422 and outputs a result. An eleventh inverter 424 receives the output signal from the first delay unit 423, reverses the output signal from the first delay unit 423 and outputs a result.

A twelfth NAND gate 425 receives the output signal of the eleventh inverter 424 and the first enable signal (dll_en0), performs a NAND operation and outputs a result. A twelfth inverter 426 receives the output signal from the twelfth NAND gate 425, reverses the output signal of the twelfth NAND gate 425 and outputs a result.

A $13^{th}$ inverter 427 receives an output signal of the tenth NAND gate 416, reverses the output signal of the tenth NAND gate 416 and outputs a result. A $14^{th}$ inverter 428 receives an output signal of the $13^{th}$ inverter 427, reverses the output signal of the $13^{th}$ inverter 427 and outputs a result.

A $13^{th}$ NAND gate 429 receives output signals of the twelfth inverter 426 and the $14^{th}$ inverter 428, performs a NAND operation and outputs a result.

A $15^{th}$ inverter 430 receives an output signal of the $13^{th}$ NAND gate 429, reverses the output signal of the $13^{th}$ NAND gate 429 and outputs a result. A $16^{th}$ inverter 431 receives an output signal of the $15^{th}$ inverter 430, reverses the output signal of the $15^{th}$ inverter 430 and outputs a result.

A $17^{th}$ inverter 432 receives an output signal of the $16^{th}$ inverter 431, reverses the output signal of the $16^{th}$ inverter 431 and outputs the dividing cycle signal (det_cyc). A $18^{th}$ inverter 433 receives an output signal of the $14^{th}$ inverter 428, reverses the output signal of the $14^{th}$ inverter 428 and outputs a second enable signal (dll_en2) of a plurality of the enable signals.

Figure 5:
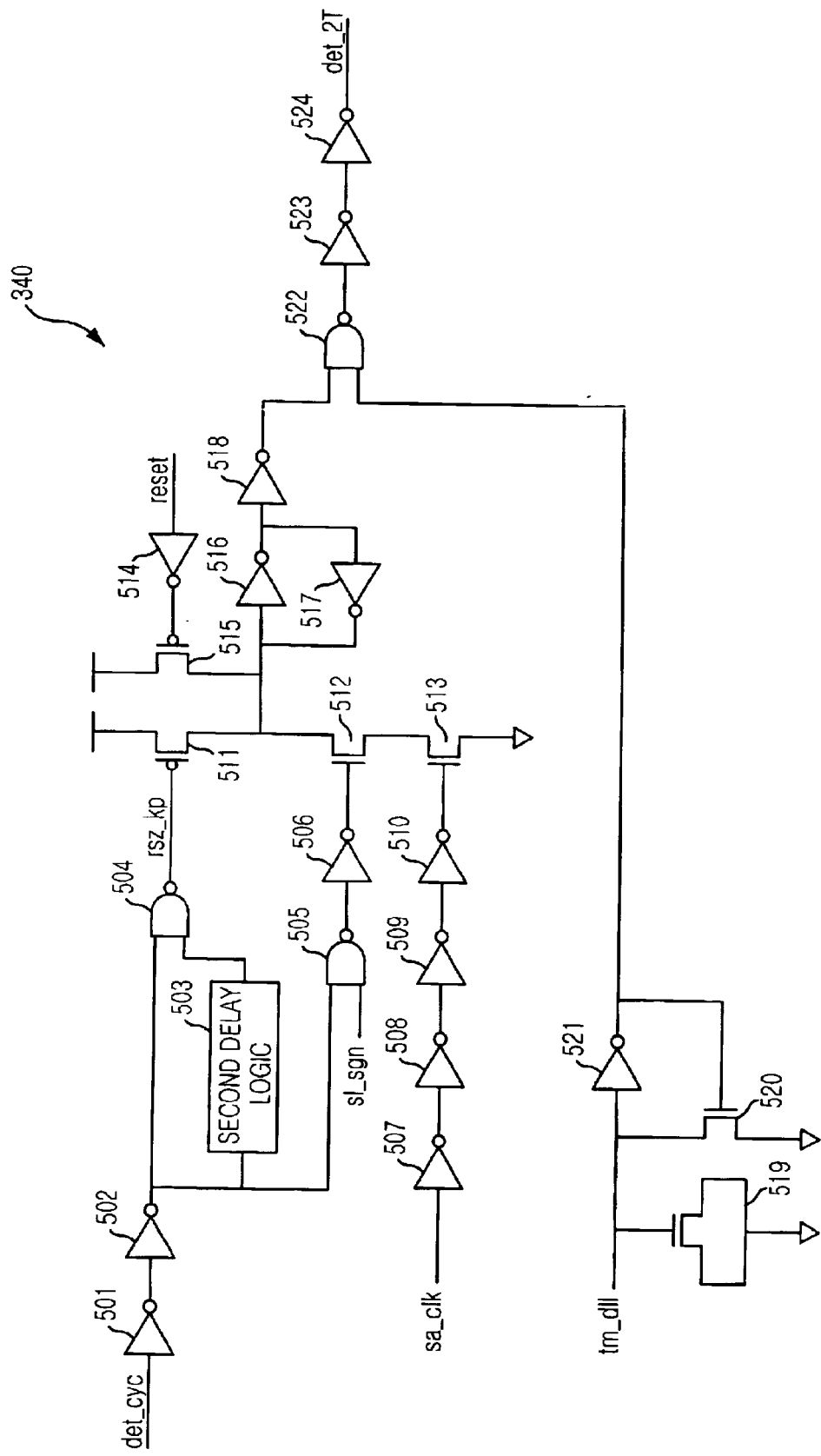
FIG. 5 is a block diagram showing a dividing controller in the DLL circuit in accordance with the present invention.

FIG. 5 is a block diagram showing a dividing controller in the DLL circuit in accordance with the present invention.

A $19^{th}$ inverter 501 receives the dividing cycle signal (det_cyc), reverses the dividing cycle signal (det_cyc) and outputs a result. A $20^{th}$ inverter 502 receives an output signal of the $19^{th}$ inverter 501, reverses the output signal of the $19^{th}$ inverter 501 and outputs a result.

A second delay unit 503 receives an output signal of the $20^{th}$ inverter 502, delays the output signal of the $20^{th}$ inverter 502 and outputs a result. A $14^{th}$ NAND gate 504 receives an output signal of the second delay unit 503 and an output signal of the $20^{th}$ inverter 502, performs a NAND operation and outputs a result.

A $15^{th}$ NAND gate 505 receives the output signal of the $20^{th}$ inverter 502 and the second comparison signal (sl_sgn), performs a NAND operation and outputs a result. A $21^{st}$ inverter 506 receives an output signal of the $15^{th}$ NAND gate 505, reverses the output signal of the $15^{th}$ NAND gate 505 and outputs a result.

A $22^{nd}$ inverter 507 receives the sample clock signal (sa_clk), reverses the sample clock signal (sa_clk) and outputs a result. A $23^{rd}$ inverter 508 receives an output signal of the $22^{nd}$ inverter 507, reverses the output signal of the $22^{nd}$ inverter 507 and outputs a result.

A $24^{th}$ inverter 509 receives an output signal of the $23^{rd}$ inverter, reverses the output signal of the $23^{rd}$ inverter and outputs a result. A $25^{th}$ inverter 510 receives an output signal of the $24^{th}$ inverter 509, reverses the output signal of the $24^{th}$ inverter 509 and outputs a result.

A source of a first PMOS transistor 511 is coupled to a power unit and a gate of the first PMOS transistor 511 receives an output signal of the $14^{th}$ NAND gate 504. A drain of a first NMOS transistor 512 is coupled to a drain of the first PMOS transistor 511 and a gate of the first NMOS transistor 512 receives an output signal of the $21^{th}$ inverter 506.

A drain of a second NMOS transistor 513 is coupled to a source of the first NMOS transistor 512, a source of the second NMOS transistor 513 is grounded and a gate of the second NMOS transistor 513 receives an output signal of the $25^{th}$ inverter 510.

A $26^{th}$ inverter 514 receives the reset signal (reset), reverses the reset signal (reset) and outputs a result. A source of a second PMOS transistor 515 is coupled to a power, a gate of the second PMOS transistor 515 receives an output signal of the $26^{th}$ inverter 514 and a drain of the second PMOS transistor 515 is coupled to the drain of the first PMOS transistor 511.

A $27^{th}$ inverter 516 receives a signal from the drain of the first PMOS transistor 511, reverses the signal from the drain of the first PMOS transistor 511 and outputs a result.

A $28^{th}$ inverter 517 receives an output signal of the $27^{th}$ inverter 516, reverses the output signal of the $27^{th}$ inverter 516 and outputs a result to the $27^{th}$ inverter 516. A $29^{th}$ inverter 518 receives an output signal of the $27^{th}$ inverter 516, reverses the output signal of the $27^{th}$ inverter 516 and outputs a result.

A gate of a third NMOS transistor 519 receives the test mode signal (tm_dll). A drain and a source of the third NMOS transistor 519 are common-grounded and operating as a capacitor.

A drain of a forth NMOS transistor 520 receives the test mode signal (tm_dll) and a source of the forth NMOS transistor 520 is grounded. A $30^{th}$ inverter 521 receives the test mode signal (tm_dll), reverses the test mode signal (tm_dll) and outputs a result to the forth NMOS transistor 520.

A 16th NAND gate 522 receives an output signal of the 29th inverter 518 and an output signal of the 30th inverter 521, performs a NAND operation and outputs a result. A 31st inverter 523 receives an output signal of the 16th NAND gate 522, reverses the output signal of the 16th NAND gate 522 and outputs a result. A 32nd inverter 524 receives an output signal of the inverter 523, reverses the output signal of the inverter 523 and outputs a result.

Figure 6:
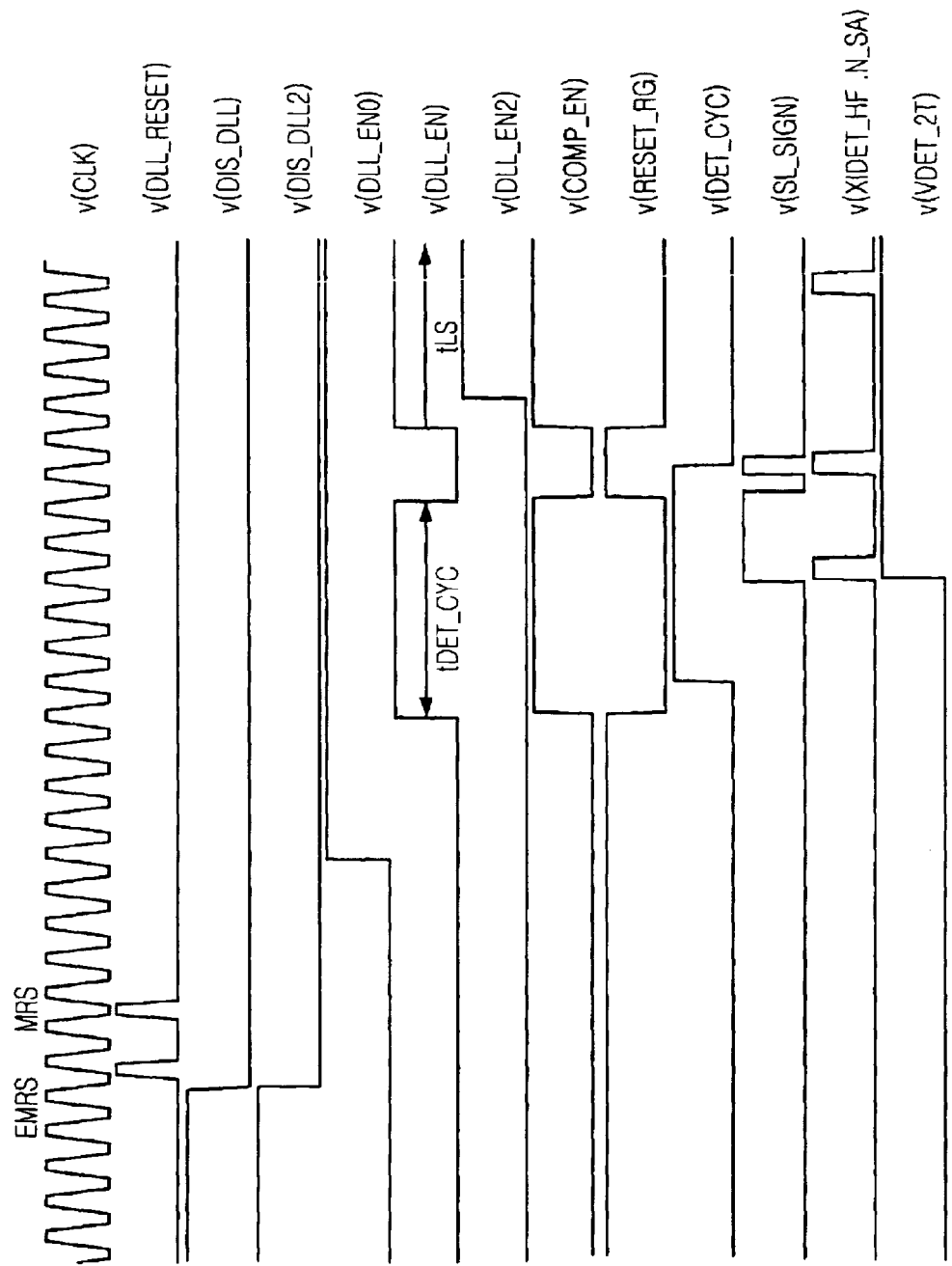
FIG. 6 is a timing diagram of the DLL circuit in accordance with the present invention.

FIG. 6 is a timing diagram of the DLL circuit in accordance with a preferred embodiment of the present invention.

The divider 310 receives the clock signal CLK from the clock buffer 210 and performs a division operation of the clock signal CLK by using a plurality of the RT flip-flops in the divider 310. The divider is used for preventing failure of an initial locking occurred at a step of the low frequency is transformed to the high frequency when the clock signal is inputted right after a power save mode. It is because the clock signal CLK is inputted without sufficient reset time. Therefore, in order to provide enough time for reset time, the clock signal is divided in 4, 8 or 16 in the divider 310 before enabling the DLL circuit.

The synchronizing unit 320 receives a plurality of the divided clock signals and generates the synchronized clock signal by synchronizing the divided clock signals at the falling edge of the clock signal CLK. Because a pulse width of the clock signal is small in the high frequency operation, a first clock of the clock signal may not be detected and a counting value of the first frequency divider 220 and the second frequency divider 260 becomes incorrect. As a result, a delay locking may be failed in the phase detector 230. Therefore, the clock signals are synchronized at the falling edge of the clock signal CLK in order to prevent the failure of delay locking in the phase detector 230.

The DLL enable signal generating unit 330 receives a plurality of the synchronized signals and the reversed signals (qa2fz, qa3f, qa3fz, qa4f, qa4fz and qa5f) of the synchronized signals from the synchronizing unit 320 and generates a plurality of enable signals and the dividing cycle signal (det_cyc). The total enable signal (dll_en) is activated at a falling edge of an eighth clock after reset. Then, the total enable signal is inactivated during input frequency detecting period (High of DET_CYC) and activated 2 clocks after the input frequency detecting period. The delay locking is executed according to an operating frequency according to a logic level of dividing control signal (det_2T). That is, the dividing control signal (det_2T) is determined during the input frequency detecting period and once the delay locking is started, two kinds of enable times exists according to the determined dividing control signal (det_2T) after delay locking step.

In case of requiring a DLL circuit for a graphic memory, which requires high speed operation, the dividing controller 340 generates the dividing control signal (det_2T) as a second logical level (High) to change the first frequency divider 220 and the second frequency divider 260, which are operated as ½ dividers, to be operated as ¼ dividers. Since the phase detector 230 performs a phase comparison in two times expanded clock cycle, the DLL can normally operate a delay locking process. In a meantime, in a case of requiring a DLL circuit for a main memory, which requires low speed operation, the dividing controller 340 generates the dividing control signal (det_2T) as a first logical level (Low) not to change the first frequency divider 220 and the second frequency divider 260, which are operated as ½ dividers and the phase comparison is performed in original clock cycle, therefore, the delay locking process can be performed in 66 MHz of the low frequency. That is, during input frequency detecting period, the dividing control signal (det_2T) becomes the second logical level (High), if the second comparison signal (sl_sgn) is the second logical level (High) after sampling the level of the second comparison signal (sl_sgn), which is a shift left signal of the phase detector 230, to the sample clock signal (ca_clk).

As mentioned above, the DLL circuit of the present invention can be used for both of memories for high operation speed and low operation speed without using a fuse or an anti-fuse by automatically controlling the DLL according to each frequency region. Therefore, a manufacturing process becomes simplified and a manufacturing cost is decreased.

While the present invention has been shown and described with respect to the particular embodiments, it will be apparent to those skilled in the art that many changes and modifications may be made without departing from the spirit and scope of the invention as defined in the appended claims.

What is claimed is:

1. A delay locked loop (DLL) circuit, comprising:
   a clock buffer for receiving an external clock signal, temporarily storing the external clock signal and outputting a buffered clock signal;
   a first frequency divider for receiving the buffered clock signal and generating a divided clock signal by dividing the buffered clock signal according to a dividing control signal;
   a phase detector for receiving the divided clock signal from the first frequency divider and a compensation clock signal, detecting phase delay of two signals, generating a first comparison signal and a second comparison signal and generating a sample clock signal in order to perform sampling of the second comparison signal;
   a DLL controller for receiving and analyzing the sample clock signal and the second comparison signal from the phase detector, and outputting the dividing control signal as a second logic level when an analyzing result is an high speed operation or outputting the dividing control signal as a first logic level when an analyzing result is low speed operation;
   a delay line for receiving the buffered clock signal from the clock buffer and the first comparison signal and the second comparison signal from the phase detector, performing shifting of the external clock signal to the left or right according to the first comparison signal and the second comparison signal, and outputting an internal clock signal;
   a second frequency divider for receiving the internal clock signal from the delay line and generating a divided internal signal by dividing the internal clock signal according to the dividing control signal; and
   a replica unit for receiving the divided internal signal from the second frequency divider, compensating the time delay between the external clock signal the internal clock signal and generating the compensation clock signal.

2. The DLL circuit as recited in claim 1, wherein the DLL controller includes:
   a divider including a plurality of RT flip-flops for receiving the buffered clock signal from the clock buffer and a reset signal from an external part and generating a plurality of divided clock signals by dividing the buffered clock signal;

a synchronizing unit including a plurality of FD flip-flops for receiving the buffered clock signal from the clock buffer, the plurality of divided clock signals from the divider and the reset signal from the external part, synchronizing the divided clock signals at a falling edge of the buffered clock signal and generating a plurality of synchronized clock signals;

a DLL enable signal generating unit for receiving the plurality of synchronized clock signals and reversed signals of the synchronized clock signals, generating a plurality of enable signals and a dividing cycle signal and controlling enable of the DLL circuit according to the enable signals; and a dividing controller for receiving the dividing cycle signal from the DLL enable signal generating unit, the sample clock signal and the second comparison signal from the phase detector, the reset signal and a test mode signal, performing sampling of the second comparison signal according to the sample clock signal, analyzing the second comparison signal and the sample clock signal in order to determine the operation speed and outputting the dividing control signal as the second logic level for the high speed operation or outputting the dividing control signal at the first logic level for the low speed operation.

3. The DLL circuit as recited in claim 2, wherein the test mode signal is used to control the dividing control signal during test.

4. The DLL circuit as recited in claim 2, wherein the DLL enable signal generating unit includes:

a first inverter for reversing a received reset signal and outputting a reversed reset signal;

a first NAND gate for receiving the second synchronized clock signal among a plurality of the synchronized clock signals and the reversed signals of the synchronized clock signals and performing a NAND operation;

a second NAND gate which is cross-coupled with the first NAND gate for receiving the reversed reset signal and performing a NAND operation;

a second inverter for receiving the output signal from the second NAND gate and reversing the output signal of the second NAND gate;

a third inverter for receiving the output signal from the second inverter, reversing the output signal and outputting a reversed signal of a first enable signal among a plurality of the enable signals;

a fourth inverter for receiving the reversed signal of the first enable signal and reversing the reversed signal of the first enable signal;

a third NAND gate for receiving the reversed signal of the first synchronized clock signal and the reversed signal of the second synchronized clock signal among the plurality of the synchronized clock signals and the reversed signals of the synchronized clock signals and performing a NAND operation;

a fourth NAND gate for receiving the reversed signal of the third synchronized clock signal and the reversed signal of the fourth synchronized clock signal among the plurality of synchronized clock signals and the reversed signals of the synchronized clock signals and performing a NAND operation;

a NOR gate for receiving the output signals from the third NAND gate and the fourth NAND gate and performing a NOR operation;

a fifth NAND gate for receiving the output signal from the NOR gate and performing a NAND operation;

a sixth NAND gate for receiving the reversed reset signal and the output signal of the fifth NAND gate and performing a NAND operation;

a fifth inverter for receiving the output signal from the sixth NAND gate and reversing the output signal;

a seventh NAND gate for receiving the third synchronized clock signal among the plurality of synchronized clock signals and the reversed signals of the synchronized clock signals and performing a NAND operation;

an eighth NAND gate which is cross-coupled with the seventh NAND gate for receiving the output signal from the fifth inverter and performing a NAND operation;

a ninth NAND gate for receiving the fourth synchronized clock signal among the plurality of synchronized clock signals and the reversed signals of the synchronized clock signals and performing a NAND operation;

a tenth NAND gate which is cross-coupled with the ninth NAND gate for receiving the reversed reset signal and performing a NAND operation;

an eleventh NAND gate for receiving the output signals of the eighth NAND gate and the tenth NAND gate and performing a NAND operation;

a sixth inverter for receiving the output signal from the eleventh NAND gate and reversing the output signal of the eleventh NAND gate;

a seventh inverter for receiving the output signal of the sixth inverter and reversing the output signal of the sixth inverter;

an eighth inverter for receiving the output signal from the seventh inverter and reversing the output signal from the seventh inverter;

a ninth inverter for receiving the output signal from the eighth inverter and reversing the output signal of the eighth inverter;

a tenth inverter for receiving the output signal from the ninth inverter and reversing the output signal of the ninth inverter;

a first delay unit for receiving the output signal from the tenth inverter and delaying the output signal from the tenth inverter;

an eleventh inverter for receiving the output signal from the first delay unit and reversing the output signal from the first delay unit;

a twelfth NAND gate for receiving the output signal of the eleventh inverter and the first enable signal and performing a NAND operation;

a twelfth inverter for receiving the output signal from the twelfth NAND gate and reversing the output signal of the twelfth NAND gate;

a $13^{th}$ inverter for receiving an output signal of the tenth NAND gate and reversing the output signal of the tenth NAND gate;

a $14^{th}$ inverter for receiving an output signal of the $13^{th}$ inverter and reversing the output signal of the $13^{th}$ inverter;

a $13^{th}$ NAND gate for receiving output signals of the twelfth inverter and the $14^{th}$ inverter and performing a NAND operation;

a $15^{th}$ inverter for receiving an output signal of the $13^{th}$ NAND gate and reversing the output signal of the $13^{th}$ NAND gate;

a $16^{th}$ inverter for receiving an output signal of the $15^{th}$ inverter and reversing the output signal of the $15^{th}$ inverter;

a 17$^{th}$ inverter for receiving an output signal of the 16$^{th}$ inverter and reversing the output signal of the 16$^{th}$ inverter; and a 18$^{th}$ inverter for receiving an output signal of the 14$^{th}$ inverter and reversing the output signal of the 14$^{th}$ inverter.

5. The DLL circuit as recited in claim 2, wherein the dividing controller includes:

a 19$^{th}$ inverter for receiving the dividing cycle signal and reversing the dividing cycle signal;

a 20$^{th}$ inverter for receiving an output signal of the 19$^{th}$ inverter and reversing the output signal of the 19$^{th}$ inverter;

a second delay unit for receiving an output signal of the 20$^{th}$ inverter and delaying the output signal of the 20$^{th}$ inverter;

a 14$^{th}$ NAND gate for receiving an output signal of the second delay unit and an output signal of the 20$^{th}$ inverter and performing a NAND operation;

a 15$^{th}$ NAND gate for receiving the output signal of the 20$^{th}$ inverter and the second comparison signal and performs a NAND operation;

a 21$^{st}$ inverter for receiving an output signal of the 15NAND gate and reversing the output signal of the 15$^{th}$ NAND gate;

a 22$^{nd}$ inverter for receiving the sample clock signal and reversing the sample clock signal;

a 23$^{rd}$ inverter for receiving an output signal of the 22$^{nd}$ inverter and reversing the output signal of the 22$^{nd}$ inverter a 24$^{th}$ inverter for receiving an output signal of the 23$^{rd}$ inverter and reversing the output signal of the 23$^{rd}$ inverter;

a 25$^{th}$ inverter for receiving an output signal of the 24$^{th}$ inverter and reversing the output signal of the 24$^{th}$ inverter;

a first PMOS transistor, wherein a source of the first PMOS transistor is coupled to a power unit and a gate of the first PMOS transistor receives an output signal of the 14$^{th}$ NAND gate;

a first NMOS transistor, wherein a drain of the first NMOS transistor is coupled to a drain of the first PMOS transistor and a gate of the first NMOS transistor receives an output signal of the 21$^{st}$ inverter;

a second NMOS transistor, wherein a drain of a second NMOS transistor is coupled to a source of the first NMOS transistor, a source of the second NMOS transistor is grounded and a gate of the second NMOS transistor receives an output signal of the 25$^{th}$ inverter;

a 26$^{th}$ inverter for receiving the reset signal and reversing the reset signal;

a second PMOS transistor, wherein a source of the second PMOS transistor is coupled to a power, a gate of the second PMOS transistor receives an output signal of the 26$^{th}$ inverter and a drain of the second PMOS transistor is coupled to the drain of the first PMOS transistor;

a 27$^{th}$ inverter for receiving a signal from the drain of the first PMOS transistor and reversing the signal from the drain of the first PMOS transistor;

a 28$^{th}$ inverter for receiving an output signal of the 27$^{th}$ inverter and reversing the output signal of the 27$^{th}$ inverter;

a 29$^{th}$ inverter for receiving an output signal of the 27$^{th}$ inverter and reversing the output signal of the 27$^{th}$ inverter;

a third NMOS transistor, wherein a gate of the third NMOS transistor receives the test mode signal, a drain and a source of the third NMOS transistor are common-grounded and operating as a capacitor;

a fourth NMOS transistor, wherein a drain of the fourth NMOS transistor receives the test mode signal and a source of the fourth NMOS transistor is grounded;

a 30$^{th}$ inverter for receiving the test mode signal and reversing the test mode signal;

a 16$^{th}$ NAND gate for receiving an output signal of the 29$^{th}$ inverter and an output signal of the 30$^{th}$ inverter and performing a NAND operation;

a 31$^{st}$ inverter for receiving an output signal of the 16$^{th}$ NAND gate and reversing the output signal of the 16$^{th}$ NAND gate; and a 32$^{nd}$ inverter for receiving an output signal of the inverter and reversing the output signal of the inverter.

* * * * *